United States Patent
Chen et al.

(10) Patent No.: US 12,132,450 B2
(45) Date of Patent: Oct. 29, 2024

(54) POWER AMPLIFIERS

(71) Applicant: Taiwan Semiconductor Manufacturing Company, Ltd., Hsinchu (TW)

(72) Inventors: Wen-Sheng Chen, Taipei (TW); En-Hsiang Yeh, Hsinchu (TW); Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 338 days.

(21) Appl. No.: 17/695,500

(22) Filed: Mar. 15, 2022

(65) Prior Publication Data

US 2023/0125874 A1    Apr. 27, 2023

Related U.S. Application Data

(60) Provisional application No. 63/270,829, filed on Oct. 22, 2021.

(51) Int. Cl.
| | |
|---|---|
| *H03F 1/30* | (2006.01) |
| *H03F 3/24* | (2006.01) |
| *H04B 1/16* | (2006.01) |
| *H04B 1/18* | (2006.01) |

(52) U.S. Cl.
CPC ............... *H03F 1/30* (2013.01); *H03F 3/245* (2013.01); *H04B 1/1607* (2013.01); *H04B 1/18* (2013.01)

(58) Field of Classification Search
CPC ........................................................ H03F 1/30
See application file for complete search history.

(56) References Cited

U.S. PATENT DOCUMENTS

| | | |
|---|---|---|
| 6,094,084 A | 7/2000 | Abou-Allam et al. |
| 8,022,776 B2 | 9/2011 | Chang et al. |
| 10,084,422 B1 | 9/2018 | Elzeftawi |
| 2011/0221530 A1* | 9/2011 | Sutardja .................. H03F 3/191 330/264 |

(Continued)

FOREIGN PATENT DOCUMENTS

TW    200723678 A    6/2007

OTHER PUBLICATIONS

Park, et al., "Highly Linear CMOS Power Amplifier for mm-Wave Applications," IEEE Int. Microwave Symp. Dig., pp. 1-3, May 2016.

(Continued)

*Primary Examiner* — Hsinchun Liao
(74) *Attorney, Agent, or Firm* — MERCHANT & GOULD P.C.

(57) ABSTRACT

A power amplifier structure includes at least one power amplifier circuit. The power amplifier circuit includes a transistor of a first type connected in series with a transistor of a second type connected between the same voltage supply. In a non-limiting nonexclusive example, an n-type transistor is connected in series with a p-type transistor connected between Vdd. The power amplifier structure can include two amplifier circuits configured in a differential amplifier structure. The differential amplifier structure includes two amplifier circuits operably connected in parallel between the same voltage supply.

20 Claims, 7 Drawing Sheets

(56) References Cited

U.S. PATENT DOCUMENTS

2020/0212859 A1* 7/2020 Kim .................. H03F 1/223
2020/0328746 A1* 10/2020 Park .................. H03K 19/0016

OTHER PUBLICATIONS

Jayamon, et al., "A PMOS mmwave power amplifier at 77 GHz with 90 mW output power and 24% efficiency," in Proc. IEEE RFIC, pp. 262-265, May 2016.
Huang et al., "An Inductive-Neutralized 26-dBm K -/ Ka-Band Power Amplifier with 34% PAE in 90-nm CMOS," IEEE Transactions on Microwave Theory and Techniques, vol. 60, No. 11, pp. 4427-4440 (Nov. 2019).
Tiwari et al., "Jayanta Figure Analysis of 2.5 GHz Folded Cascode LNA using High-Q Layout Optimized Inductors," 2015 IEEE Asia Pacific Conference on Postgraduate Research in Microelectronics and Electronics (PrimeAsia), pp. 94-97 (2015).

* cited by examiner

POWER AMPLIFIERS

PRIORITY CLAIM AND CROSS-REFERENCE

The present application claims the benefit of U.S. Provisional Patent Application No. 63/270,829 titled "POWER AMPLIFIERS" filed on Oct. 22, 2021, of which the entire disclosure is hereby incorporated by reference in its entirety.

BACKGROUND

Power amplifiers are used in a variety of applications. For example, power amplifiers can be used in millimeter-wave fifth generation (5G) systems. In 5G systems, higher linearity for high-order modulation may be desirable in a power amplifier to meet the higher data rate, lower latency requirements in a system. Additionally or alternatively, the reliability of the power amplifier in a 5G system may also be a concern for product life. Hot carrier injection (HCI), time dependent dielectric breakdown (TDDB), and bias temperature instability (BTI) are possible reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Identical reference numerals have been used, where possible, to designate identical features that are common to the figures.

DETAILED DESCRIPTION

Figure 1:
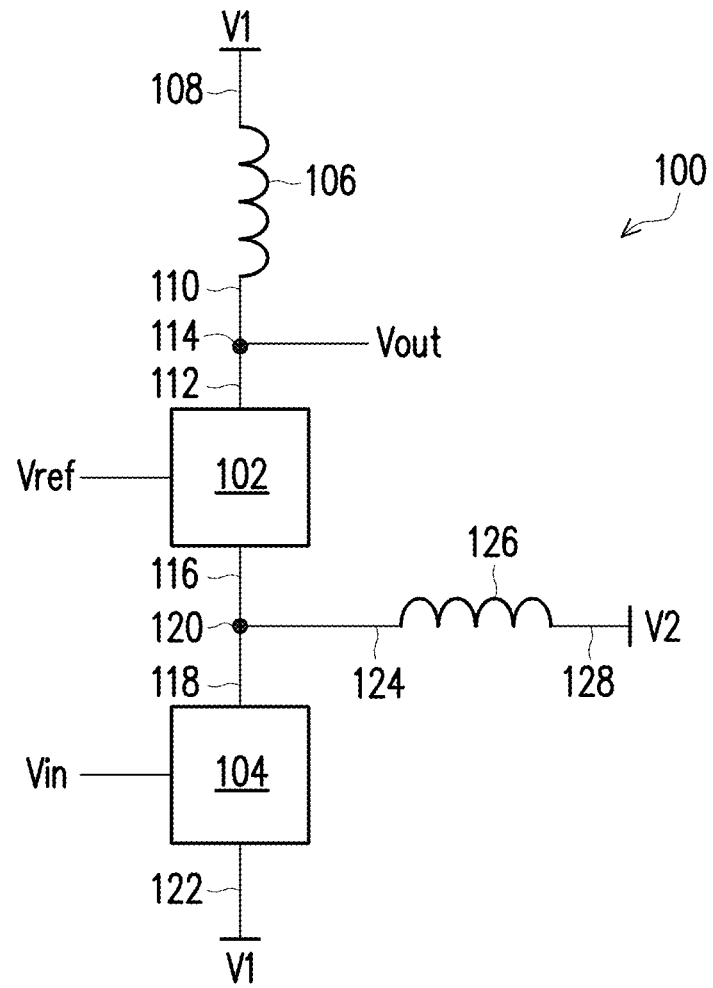
FIG. 1 illustrates a first example of a power amplifier structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments disclosed herein provide power amplifier structures that include one or more power amplifier circuits. Each power amplifier circuit includes complementary devices (e.g., complementary transistors) connected in series between the same first power supply V1. In one embodiment, a power amplifier circuit includes a transistor of a first type and a transistor of a second type connected in series between V1. For example, the transistor of the first type can be a p-type transistor (e.g., p-channel metal-oxide-silicon (pMOS) transistor) and the transistor of the second type may be an n-type transistor (e.g., n-channel metal-oxide-silicon (nMOS) transistor).

The power amplifier further includes an inductor connected in series between the first power supply V1 and the power amplifier circuit. The inductor connects to the power amplifier circuit at a connecting node. The output signal line is also connected to the connecting node. The inductor assists in providing increased or maximum power to the output signal Vout on the output signal line. Additionally or alternatively, the inductor reduces or cancels the parasitic capacitance at the connecting node.

Another inductor is connected to the power amplifier circuit at an intermediate node where the complementary transistors are connected together. The intermediate node is connected to a second power supply V2 through the inductor. The inductor is configured to reduce or cancel parasitic capacitance at the intermediate node, which can decrease power loss and increase the power in Vout. The inductor can also enhance the overall performance of the power amplifier structure 100.

In some embodiments, a power amplifier structure includes two power amplifier circuits connected in parallel between the same power supply V1. A second power supply V2 connects to the two power amplifier circuits through inductors operably connected to the power amplifier circuits at respective intermediate nodes. The power amplifier structure is a differential power amplifier structure. A first transformer is operable to split an input signal into two gate signals with opposite phases (e.g., a phase difference of one hundred and eighty degrees). A second transformer is operable to combine the output signal from one power amplifier circuit and the output signal from the other power amplifier circuit into the output signal Vout.

In one embodiment, each power amplifier circuit is configured as a cascode amplifier. The casode amplifier is a two-stage amplifier that includes a common-source (CS) transistor (first stage) feeding into a common-gate (CG) transistor (second stage).

The complementary transistors provide various advantages to the power amplifier structures. One advantage can be a mitigation of the amplitude-to-phase (AM-PM) distortion and enhanced modulation quality. Another advantage may be an increase in the reliability of the power amplifier structures (e.g., via the p-type transistor). Yet another advantage can be the power amplifier structures have higher linearity (e.g., via the n-type transistor). Additionally or alternatively, configuring one transistor as a CG amplifier may increase the reliability of the power amplifier structures.

In some instances, the second power supply V2 can supply a lower supply voltage when compared to conventional power amplifiers.

These and other embodiments are discussed below with reference to FIGS. 1-7. However, those skilled in the art will readily appreciate that the detailed description given herein with respect to these Figures is for explanatory purposes only and should not be construed as limiting.

FIG. 1 illustrates a first example of a power amplifier structure in accordance with some embodiments. The power amplifier structure 100 includes a transistor 102 of a first type, another transistor 104 of a second type, and an inductor 106 operably connected in series between the same first voltage supply V1. The inductor 106 can be constructed or modified to match an application corresponding to the actual load. For example, the inductance of the inductor 106 can have a value that provides more power with less efficiency. Alternatively, the inductance may be set so the inductor 106 is more efficient and provides less power. In one embodiment, the transistor 102 is configured as a CG amplifier and the transistor 104 as a CS amplifier.

A terminal 108 of the inductor 106 is operably connected to V1. The other terminal 110 of the inductor 106 and a terminal 112 of the transistor 102 are operably connected to the connecting node 114. An output signal line (Vout) is also operably connected to the connecting node 114.

The other terminal 116 of the transistor 102 and a terminal 118 of the transistor 104 are operably connected to the intermediate node 120. The other terminal 122 of the transistor 104 is operably connected to V1. A terminal 124 of another inductor 126 is operably connected to the intermediate node 120 and the other terminal 128 of the inductor 126 is operably connected to a second voltage supply V2. In one embodiment, the inductors 106, 126 are implemented as inductor circuits. In another embodiment, at least one of the inductors 106, 126 is implemented as a co-planar waveguide transmission line.

A reference voltage supply Vref is operably connected to a terminal (e.g., a gate) of the transistor 102. In one embodiment, Vref is Vss (e.g., ground). An input power supply Vin is operably connected to a terminal (e.g., a gate) of the transistor 104.

As noted earlier, the transistor 102 is a first type of transistor and the transistor 104 is a second type of a transistor. As will be described in conjunction with FIG. 2, the transistor 102 is a p-type transistor, such as a pMOS transistor, and the transistor 104 is an n-type transistor, such as an nMOS transistor. Transistors other than PMOS and NMOS can be used in other embodiments. In another embodiment shown in FIG. 3, the transistor 102 is an n-type transistor and the transistor 104 is a p-type transistor.

Figure 2:
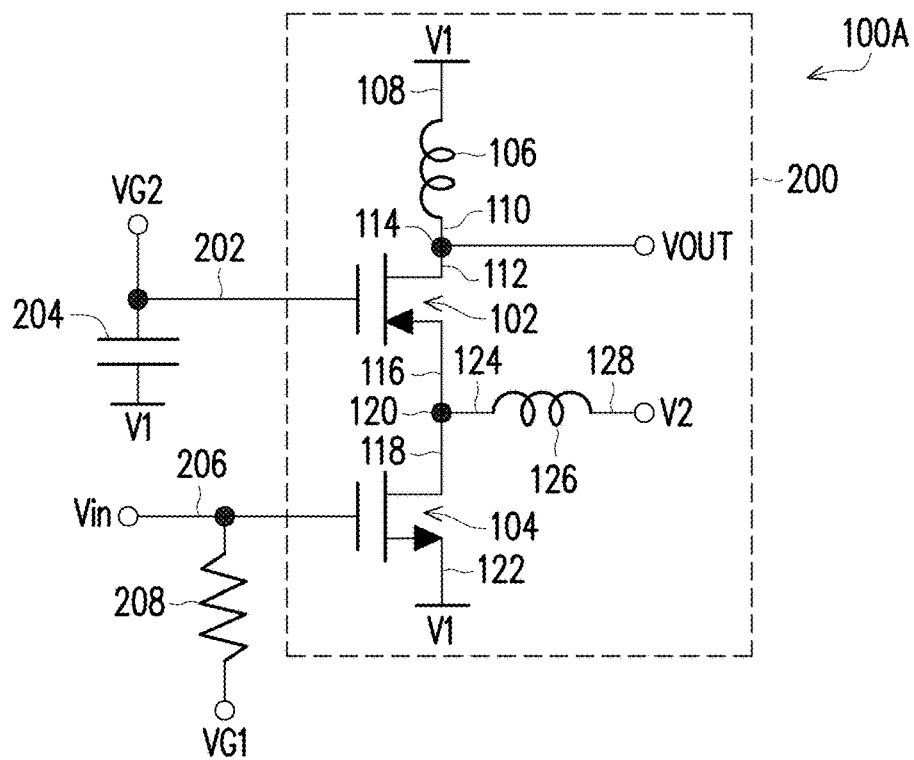
FIG. 2 illustrates a first schematic diagram of the power amplifier structure shown in FIG. 1 in accordance with some embodiments.

FIG. 2 illustrates a first schematic diagram of the power amplifier structure shown in FIG. 1 in accordance with some embodiments. The power amplifier structure 100A includes a power amplifier circuit 200 that includes the transistor 102, the transistor 104, and the inductor 106 all operably connected in series between the first power supply V1, and the inductor 126 operably connected between the intermediate node 120 and the second power supply V2.

One terminal 108 of the inductor 106 is operably connected to V1. Another terminal 110 of the inductor 106 and the terminal 112 of the transistor 102 are operably connected to the connecting node 114. The output signal line (Vout) is also operably connected to the connecting node 114.

Another terminal 116 of the transistor 102 and the terminal 118 of the transistor 104 are operably connected to the intermediate node 120. Another terminal 122 of the transistor 104 is operably connected to V1. A terminal 124 of the inductor 126 is operably connected to the intermediate node 120 and the other terminal 128 of the inductor 126 is operably connected to a second voltage supply V2.

In the illustrated embodiment, the transistor 102 is a p-type transistor, the transistor 104 is an n-type transistor, V1 is Vss, and V2 is Vdd. In a non-limiting nonexclusive example, Vss is substantially zero volts (e.g., ground) and Vdd is substantially 0.9 volts. Vss and Vdd can supply different voltage levels in other embodiments.

As described earlier, the inductor 106 is operably connected between V1 and the connecting node 114 and the output signal line Vout is operably connected to the connecting node 114. The inductor 106 can provide increased or maximum power to the output signal Vout on the output signal line. In some instances, the inductor 106 reduces or cancels the parasitic capacitance at the connecting node 114.

The inductor 126 is operably connected between the intermediate node 120 and V2. As described previously, the inductor 126 is configured to reduce or cancel the parasitic capacitance at the intermediate node 120, which can decrease power loss and increase the power in Vout. The inductor 126 can also enhance the overall performance of the power amplifier structure 100A. In some embodiments, the inductor 126 acts as a direct current (DC) feed for a power supply at a designed or specific frequency.

A power supply VG2 is operably connected to a terminal 202 of the transistor 102. A capacitor 204 is also operably connected between the terminal 202 of the transistor 102 and V1. The capacitor 204 acts as a ground on the terminal 202 of the transistor 102, which enables the transistor 102 to operate as a CG amplifier.

An input voltage supply Vin is operably connected to the terminal 206 of the transistor 104. A resistor 208 is operably connected between the terminal 206 of the transistor 104 and a power supply VG1. In a non-limiting nonexclusive example, the resistance of the resistor 208 is two kiloohms and the capacitance of the capacitor 204 is two picofarad.

In one embodiment, VG2 and VG1 each supply substantially 0.2 volts. The voltage levels of VG1 and VG2 are set to turn on the transistors 102, 104. With the transistors 102, 104 turned on, an input voltage level applied to Vin is amplified and output as Vout. As described earlier, the transistor 104 can be configured as a CS amplifier. In this example embodiment, the transistor 104 acts as a transconductance amplifier that outputs a current at the terminal 118 that is proportional to Vin. With the transistor 102 configured as a CG amplifier, the terminal 116 acts as an input, so the current output from the transistor 104 flows into the transistor 102. The transistor 102 acts as a current buffer amplifier where the impedance of the transistor 102 (as viewed from the transistor 104) absorbs the current from the transistor 104, which leads to a voltage swing on Vout. The current output from the transistor 102 is output as Vout, where Vout is greater than Vin.

Figure 3:
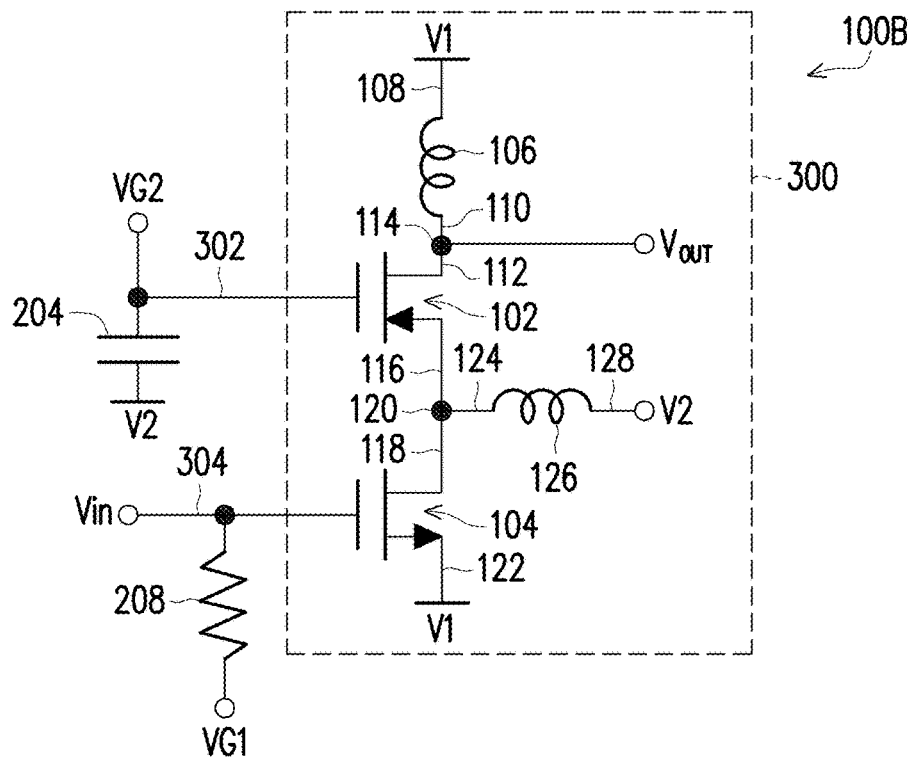
FIG. 3 illustrates a second schematic diagram of the power amplifier structure shown in FIG. 1 in accordance with some embodiments.

FIG. 3 illustrates a second schematic diagram of the power amplifier structure shown in FIG. 1 in accordance with some embodiments. The power amplifier structure 100B is similar to the power amplifier structure 100A shown in FIG. 2 except for the types of transistors 102, 104 and the voltage levels of V1 and V2. The power amplifier structure 100B includes a power amplifier circuit 300 that includes the transistor 102, the transistor 104, and the inductor 106 all operably connected in series between the same power supply V1, as well as the inductor 126 that is operably connected between the intermediate node 120 and the power supply V2. In the illustrated embodiment, the transistor 102 is an n-type transistor, the transistor 104 is a p-type transistor, V1 is Vdd, and V2 is Vss (e.g., ground).

One terminal 108 of the inductor 106 is operably connected to V1. Another terminal 110 of the inductor 106 and the terminal 112 of the transistor 102 are operably connected to the connecting node 114. The output signal line (Vout) is also operably connected to the connecting node 114.

Another terminal 116 of the transistor 102 and the terminal 118 of the transistor 104 are operably connected to the intermediate node 120. Another terminal 122 of the transistor 104 is operably connected to V1. A terminal 124 of the inductor 126 is operably connected to the intermediate node 120 and the other terminal 128 of the inductor 126 is operably connected to a second voltage supply V2.

The power supply VG2 is operably connected to the terminal 302 of the transistor 102. The capacitor 204 is also operably connected between the terminal 302 of the transistor 102 and V2 (Vss). The input power supply Vin is operably connected to the terminal 304 of the transistor 104. The resistor 208 is also operably connected between the terminal 304 of the transistor 104 and the power supply VG1.

Like the embodiment shown in FIG. 2, the power amplifier structure 100B is implemented as a cascode amplifier. The transistor 102 is configured as a CG amplifier and the transistor 104 as a CS amplifier. In some embodiments, the power amplifier structure 100B may increase the reliability of the power amplifier structure 100b because the p-type transistor 104 is the CS amplifier.

Similar to the FIG. 2 embodiment, VG2 and VG1 each supply substantially 0.2 volts. The voltage levels of VG1 and VG2 are set to turn on the transistors 102, 104. With the transistors 102, 104 turned on, an input voltage level applied to Vin is amplified and output as Vout. The transistor 102 may be configured as a CG amplifier and the transistor 104 can be configured as a CS amplifier. As such, the transistor 104 acts as a transconductance amplifier that outputs a current at the terminal 118 that is proportional to Vin. With the transistor 102 configured as a CG amplifier, the terminal 116 acts as an input, so the current output from the transistor 104 flows into the transistor 102. The transistor 102 acts as a current buffer amplifier where the impedance of the transistor 102 (as viewed from the transistor 104) absorbs the current from the transistor 104, which leads to a voltage swing on Vout. The current output from the transistor 102 is output as Vout, where Vout is greater than Vin.

Figure 4:
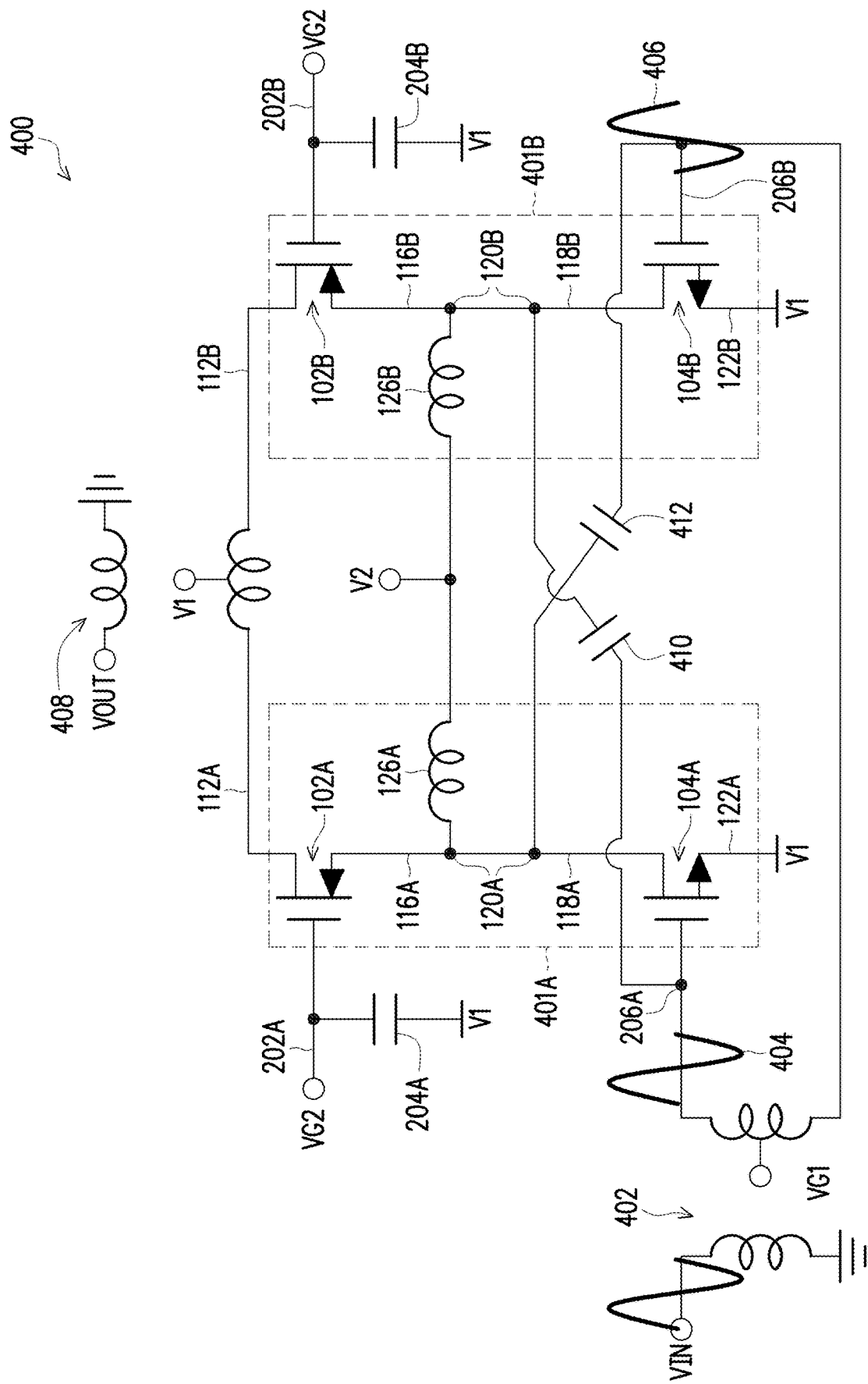
FIG. 4 illustrates a schematic diagram of a second example of a power amplifier structure in accordance with some embodiments.

FIG. 4 illustrates a schematic diagram of a second example of a power amplifier structure in accordance with some embodiments. The power amplifier structure 400 includes two power amplifier circuits 401A, 401B operably connected in parallel between the same power supply V1. Each power amplifier circuit 401A, 401B includes the transistor 102 (transistors 102A, 102B) operably connected in series with the transistor 104 (transistors 104A, 104B) between V1, as well as the inductor 126 (inductors 126A, 126B) operably connected between the intermediate node 120 (intermediate nodes 120A, 120B) and the power supply V2. In the illustrated embodiment, the transistors 102A, 102B are p-type transistors, the transistors 104A, 104B are n-type transistors, V1 is Vss, and V2 is Vdd. In some embodiments, the transistors 104A, 104B are configured as CS amplifiers and the transistors 102A, 102B as CG amplifiers. In a non-limiting nonexclusive example, VSS is substantially ground and Vdd is substantially 0.9 volts.

An input transformer 402 is operably connected to the transistors 104A, 104B. The primary coil of the input transformer 402 receives an input power supply Vin and the secondary coil is operably connected to the power supply VG1 and the terminals 206A, 206B of the transistors 104A, 104B. The input transformer 402 splits the Vin signal into two signals 404, 406 that are out of phase with respect to each other. In one embodiment, the signals 404, 406 have opposite phases in that the signals 404, 406 are one hundred and eighty degrees out of phase.

The signal 404 is applied to the terminal 206A of the transistor 104A in the power amplifier circuit 401A. The signal 406 is applied to the terminal 206B of the transistor 104B in the power amplifier circuit 401B. For the positive half cycle of the signal 404, the terminal 206A of the transistor 104A becomes positive and current flows to the transistor 102A. At the same time, the signal 406 has a negative half cycle, which causes the transistor 104B to turn off (e.g., no current flows). For the next half cycle, the signal 404 is in a negative half cycle and the transistor 104A is turned off (e.g., no current flows). At the same time, the signal 406 is in a positive half cycle and the transistor 104B turns on and current flows to the transistor 102B. Accordingly, for full cycles (positive and negative half cycles), each transistor 104A, 104B conducts alternately.

The output transformer 408 is operably connected to the terminals 112A, 112B of the transistors 102A, 102B in the power amplifier circuits 401A, 401B, respectively. The primary coil of the output transformer 408 is operably connected to V1 (Vss) and to the terminals 112A, 112B of respective transistors 102A, 102B. In some embodiments, the primary coil of the transformer 408 is the inductor 106 shown in FIG. 2.

The secondary coil of the output transformer 408 is operably connected to the output signal line Vout. Because the transistors 104A, 104B conduct current alternately, the transistors 102A, 102B output signals (e.g., current) alternately. The output transformer 408 combines the two output signals produced by the transistors 102A, 102B into the output signal Vout.

The capacitor 204A is operably connected between V1 (Vss) and the terminal 202A of the transistor 102A in the power amplifier circuit 401A. The power supply VG2 is also operably connected to the terminal 202A of the transistor 102A in the power amplifier circuit 401A. The capacitor 204B is operably connected between V1 (Vss) and the terminal 202B of the transistor 102B in the power amplifier circuit 401B. The power supply VG2 is also operably connected to the terminal 202B of the transistor 102B in the power amplifier circuit 401A. The capacitors 204A, 204B function similarly to the capacitor 204 in FIG. 2. In a non-limiting nonexclusive example, the voltage levels on VG1 and VG2 are substantially 0.2 volts and the capacitance of the capacitors 204A, 204B is substantially two picofarads.

The inductor 126A of the power amplifier circuit 401A is operably connected between the intermediate node 120A and V2 (Vdd). The inductor 126B of the power amplifier circuit 401B is operably connected between the intermediate node 120B and V2.

A capacitor 410 is operably connected between the intermediate node 120B in the power amplifier circuit 401B and the terminal 206A of the transistor 104A in the power amplifier circuit 401A. A capacitor 412 is operably connected between the intermediate node 120A in the power amplifier circuit 401A and the terminal 206B of the transistor 104B in the power amplifier circuit 401B. In one embodiment, the capacitors 410, 412 are neutralization capacitors that reduce or cancel the intrinsic capacitance between the terminals 206A, 206B, and respective terminals 118A, 118B (e.g., the intrinsic capacitance Cgd of the transistors 104A, 104B). Reducing or canceling the intrinsic capacitance Cgd can improve isolation (e.g., lowering reverse gain), enhance the overall gain of the power amplifier structure 400, and/or fortify the stability of the power amplifier structure 400.

Figure 5:
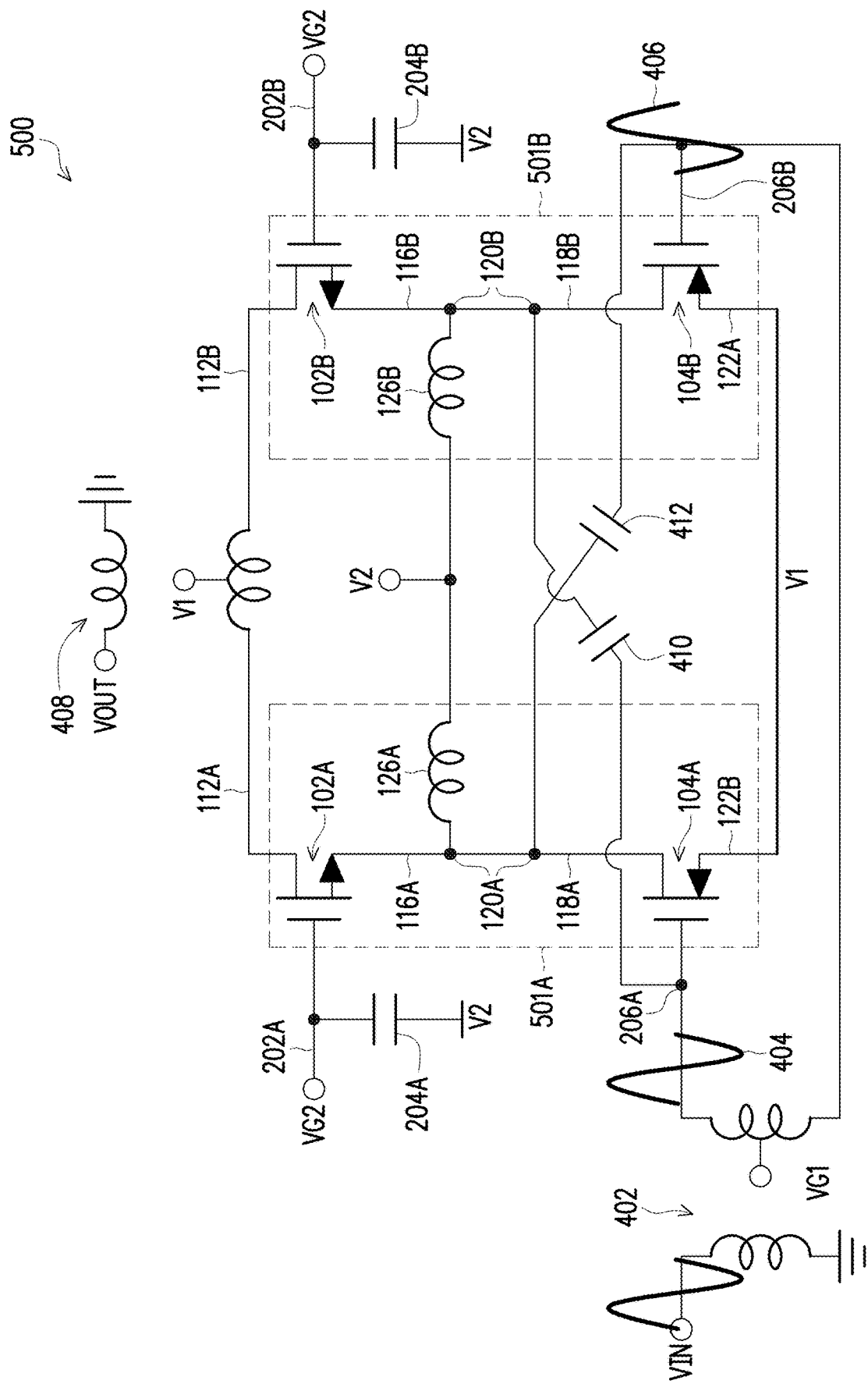
FIG. 5 illustrates a schematic diagram of third example of a power amplifier structure in accordance with some embodiments.

FIG. 5 illustrates a schematic diagram of third example of a power amplifier structure in accordance with some embodiments. The power amplifier structure 500 is similar to the power amplifier structure 400 shown in FIG. 4 except for the type of the transistors 102, 104, and the voltage levels of V1 and V2. The power amplifier structure 500 includes two power amplifier circuits 501A, 501B operably connected in parallel between the same power supply V1. Each power amplifier circuit 501A, 501B includes the transistor 102 (transistors 102A, 102B) connected in series to the transistor 104 (transistors 104A, 194B) between V1, as well as the inductor 126 (inductors 126A, 126B) that is operably connected between the intermediate node 120 (intermediate nodes 120A, 120B) and the power supply V2. In the illustrated embodiment, the transistors 102A, 102B are n-type transistors, the transistors 104A, 104B are p-type transistors, V1 is Vdd, and V2 is Vss. In some embodiments, the transistors 104A, 104B are configured as CS amplifiers and the transistors 102A, 102B as CG amplifiers. In a non-limiting nonexclusive example, Vss is substantially ground and Vdd is substantially 0.9 volts.

The input transformer 402 is operably connected to the transistors 104A, 104B. The primary coil of the input transformer 402 receives an input power supply Vin and the secondary coil is operably connected to the power supply VG1 and to the terminals 206A, 206B of the transistors 104A, 104B. The input transformer 402 splits the Vin signal into two signals 404, 406 that are out of phase with respect to each other. In one embodiment, the signals 404, 406 have opposite phases in that the signals 404, 406 are one hundred and eighty degrees out of phase.

The signal 404 is applied to the terminal 206A of the transistor 104A in the power amplifier circuit 401A. The signal 406 is applied to the terminal 206B of the transistor 104B in the power amplifier circuit 401B. For the positive half cycle of the signal 404, the terminal 206A of the transistor 104A becomes positive and current flows to the transistor 102A. At the same time, the signal 406 has a negative half cycle, which causes the transistor 104B to turn off. For the next half cycle, the signal 404 is in a negative half cycle and the transistor 104A is turned off. At the same time, the signal 406 is in a positive half cycle and the transistor 104B turns on and current flows to the transistor 102B. Accordingly, for full cycles (positive and negative half cycles), each transistor 104A, 104B conducts alternately.

The output transformer 408 is operably connected to the terminals 112A, 112B of the transistors 102A, 102B in the power amplifier circuits 401A, 401B, respectively. The primary coil of the output transformer 408 is operably connected to V1 (Vdd) and to the terminals 112A, 112B of respective power amplifier circuits 401A, 401B. In some embodiments, the primary coil of the transformer 408 is the inductor 106 shown in FIG. 3.

The secondary coil is operably connected to the output signal line Vout. Because the transistors 104A, 104 conduct current alternately, the transistors 102A, 102B output current alternately. The output transformer 408 combines the two output signals produced by the transistors 102A, 102B into the output signal Vout.

The capacitor 204A is operably connected between V2 (Vss) and the terminal 202A of the transistor 102A in the power amplifier circuit 401A. The power supply VG2 is also operably connected to the terminal 202A of the transistor 102A. The capacitor 204B is operably connected between V2 (Vss) and the terminal 202B of the transistor 102B in the power amplifier circuit 401B. The power supply VG2 is also operably connected to the terminal 202B of the transistor 102B. The capacitors 204A, 204B function similarly to the capacitor 204 in FIG. 2. In a non-limiting nonexclusive example, the voltage levels on VG1 and VG2 are substantially 0.2 volts and the capacitance of the capacitors 204A, 204B is substantially two picofarads.

The inductor 126A of the power amplifier circuit 401A is operably connected between the intermediate node 120A and V2 (Vss). The inductor 126B of the power amplifier circuit 401B is operably connected between the intermediate node 120B and V2 (Vss).

A capacitor 410 is operably connected between the intermediate node 120B in the power amplifier circuit 401B and the terminal 206A of the transistor 104A in the power amplifier circuit 401A. A capacitor 412 is operably connected between the intermediate node 120A in the power amplifier circuit 401A and the terminal 206BB of the transistor 104B in the power amplifier circuit 401B. In one embodiment, the capacitors 410, 412 are neutralization capacitors that reduce or cancel the intrinsic capacitance between the terminals 206A, 206B, and respective terminals 118A, 118B (e.g., the intrinsic capacitance Cgd of the transistors 104A, 104B). Reducing or cancelling the intrinsic capacitance can improve isolation (e.g., lowering reverse gain), enhance the overall gain of the power amplifier structure 500, and/or fortify the stability of the power amplifier structure 500.

Figure 6:
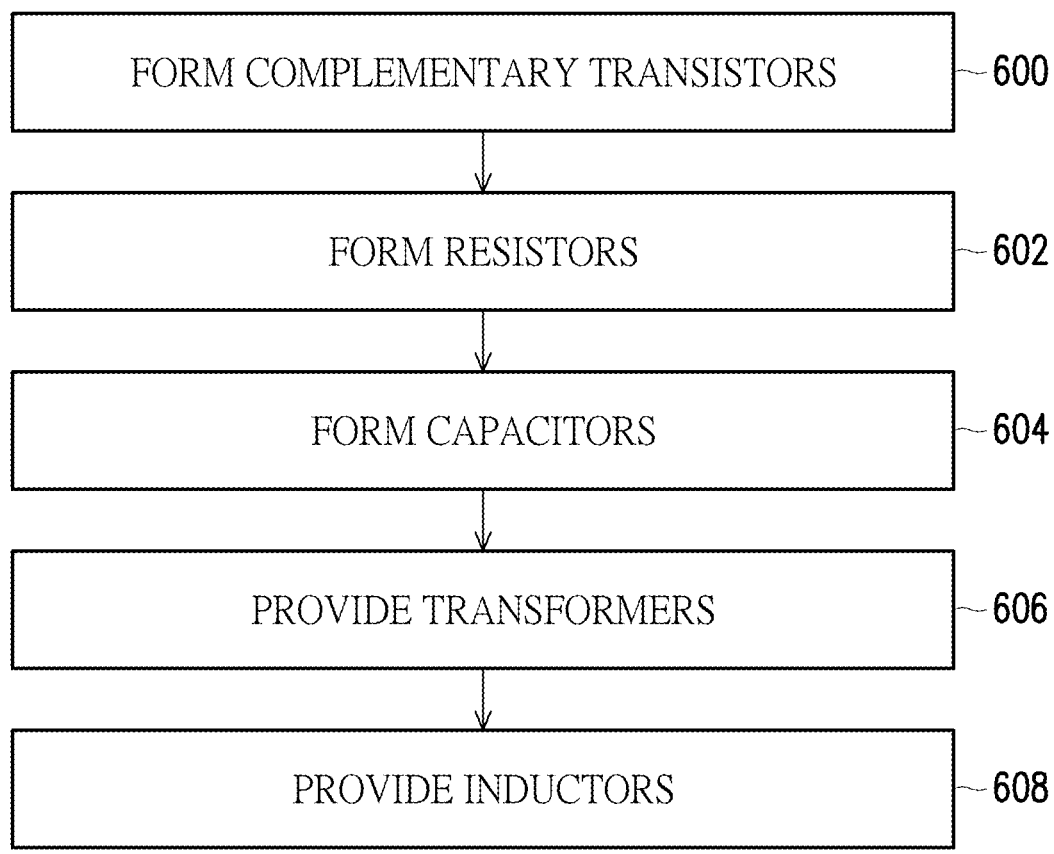
FIG. 6 illustrates a method of fabricating a power amplifier structure in accordance with some embodiments.

FIG. 6 illustrates a method of fabricating a power amplifier structure in accordance with some embodiments. Initially, as shown in block 600, the first transistor of the first type and the second transistor of the second type are formed in and on a substrate and connected in series at an intermediate node. Any suitable technique can be used to fabricate the transistors. Generally, p-type and n-type regions are formed (e.g., implanted, diffused) in a substrate, such as a silicon substrate, to produce the active regions of the transistors. For example, with a pMOS and an nMOS transistor, p-type impurities and n-type impurities are deposited and/or diffused into a substrate to form the gate, drain, and source regions.

One or more resistors are formed at block 602, and each resistor is operably connected to a gate of a respective second transistor. For example, the resistor 208 (FIGS. 2 and 3) is fabricated. In one embodiment, the resistor(s) are fabricated during the formation of the impurity regions in the substrate. In general, the ohmic value of each resistor are produced by varying the concentration of the impurity and a depth of the impurity region in the substrate (e.g., a depth of diffusion).

One or more capacitors are produced at block 604. For example, the capacitor 204 shown in FIGS. 2 and 3 or the capacitors 204A, 204B, 410, and 412 in FIGS. 4 and 5 are fabricated. A capacitor is operably connected to a gate of a respective first transistor. In the embodiments shown in FIGS. 4 and 5, the neutralization capacitors are operably connected to the power amplifier structures as described earlier. In one embodiment, a p-type or an n-type region can form a capacitor plate while the other capacitor plate is formed by depositing a conductive material on a dielectric layer on the surface of the substrate.

In embodiments that include transformers (e.g., FIGS. 4 and 5), the transformers are provided at block 606. A transformer is operably connected to the first transistors of the power amplifier structures and a second transformer is operably connected to the second transistors as described previously. In one embodiment, the transformers are provided by forming a first set of turns of a primary winding of a transformer in a lower conductive layer (e.g., a metal layer), and fabricating a second set of turns of a secondary winding of the transformer in an overlying or upper conductive layer. An insulation layer is formed between the lower and upper conductive layers. In another embodiment, the first and/or the second set of turns are formed in or across multiple conductive layers with conductive vias connecting the turns on the multiple conductive layers together. In yet another embodiment, the transformers are not fabricated in an integrated circuit (IC) that includes the power amplifier structure but instead are provided outside of the IC and operably connected to the power amplifier structure.

The inductors of the power amplifier structure are provided at block 608. For example, the inductors 106, 126 shown in FIGS. 2 and 3 are produced at block 608. An inductor is operably connected between a first transistor of a respective power amplifier structure and the first power supply. Another inductor is operably connected between an intermediate node of a respective power amplifier structure and a second power supply. In one embodiment, a transformer is fabricated by providing a magnetic core and surrounding the magnetic core with a dielectric layer. Conductive lines are formed to surround the dielectric layer. The conductive lines are formed in different layers and are connected together using conductive vias formed between the layers. In another embodiment, the inductors are not fabricated in the IC with the power amplifier structure but instead are provided outside of the IC and operably connected to the transistors in the power amplifier structure.

Other embodiments are not limited to the blocks and the order of the blocks shown in FIG. 6. A method of fabricating a power amplifier structure can implement the blocks in any suitable order. Moreover, the process can include additional blocks, such as operations for connecting the V1, V2, VG1, and VG2 power supplies to the power amplifier structure, and forming and connecting the Vin and Vout lines to the power amplifier structure.

Figure 7:
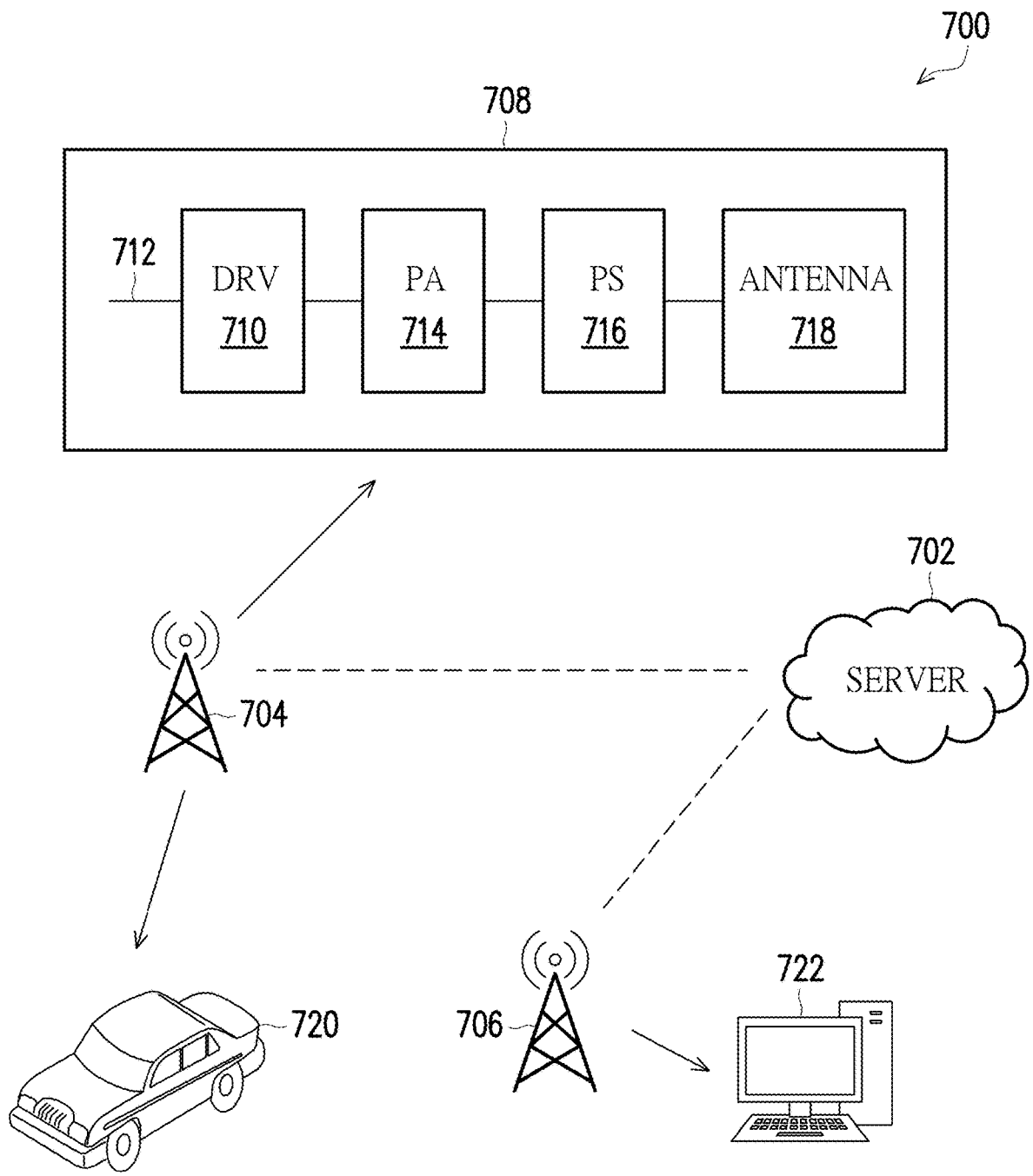
FIG. 7 illustrates an example system that is suitable to use one or more power amplifier structures in accordance with some embodiments.

FIG. 7 illustrates an example system that is suitable to use one or more power amplifier structures in accordance with some embodiments. The illustrated system 700 is a cellular network, but other embodiments are not limited to this type of system. Power amplifier structures can be used in a variety of systems, including, but not limited to, broadcast systems and audio systems.

A server 702 transmits and receives signals with towers 704, 706. In one embodiment, the towers 704, 706 are macrocells that are cellular base stations operable to transmit and receive network signals to large towers and antennas across large distances. In another embodiment, at least one of the towers 704, 706 is a small cell that provides or boosts network signals in specific areas (e.g., more densely populated areas).

The tower 704 is operable to transmit and receive network signals from an electronic device 708. The electronic device 708 is shown as a block diagram that includes example components that may be used to communicate with the tower 704. Those skilled in the art will recognize that the electronic device 708 can include other components, such as one or more processing devices, memory, input devices (e.g., virtual or physical keyboard and/or buttons), output devices (e.g., speakers, display), and network communication devices (e.g., WiFi, NFC). In one embodiment, the illustrated components are included in a cellular network communication device. The electronic device 708 can be any suitable electronic device, such as a cellular phone, a tablet computing device, and a wearable device.

A signal to be transmitted to the tower 704 is received by a driver (DRV) circuit 710 on signal line 712. The driver circuit 710 provides the signal to one or more power amplifier structures (PA) 714. Each power amplifier structure 714 can be implemented as shown in FIGS. 2-5. When there are at least two power amplifier structures 714, the power amplifier structures 714 may be operably connected in series, in parallel, or a combination thereof.

The power amplifier structure(s) 714 provide an amplified signal to a phase shifter (PS) circuit 716. In one embodiment, the phase shifter circuit 716 shifts or changes the phase of the amplified signal output from the power amplifier structure(s) 714. The phase shifter circuit 716 provides the signal to an antenna 718 that is used to transmit the signal to the tower 704.

The tower 704 is also operable to transmit and receive signals with an automobile 720. The tower 706 is operable to transmit and receive signals from the computing device 722. Some or all of these signals may be transmitted to the server 702 for processing, storage, or other operations. The automobile 720 and the computing device 722 include some or all of the driver circuit 710, the power amplifier structure(s) 714, the phase shifter circuit 716, and the antenna 718 shown in the electronic device 708.

Figure 8:
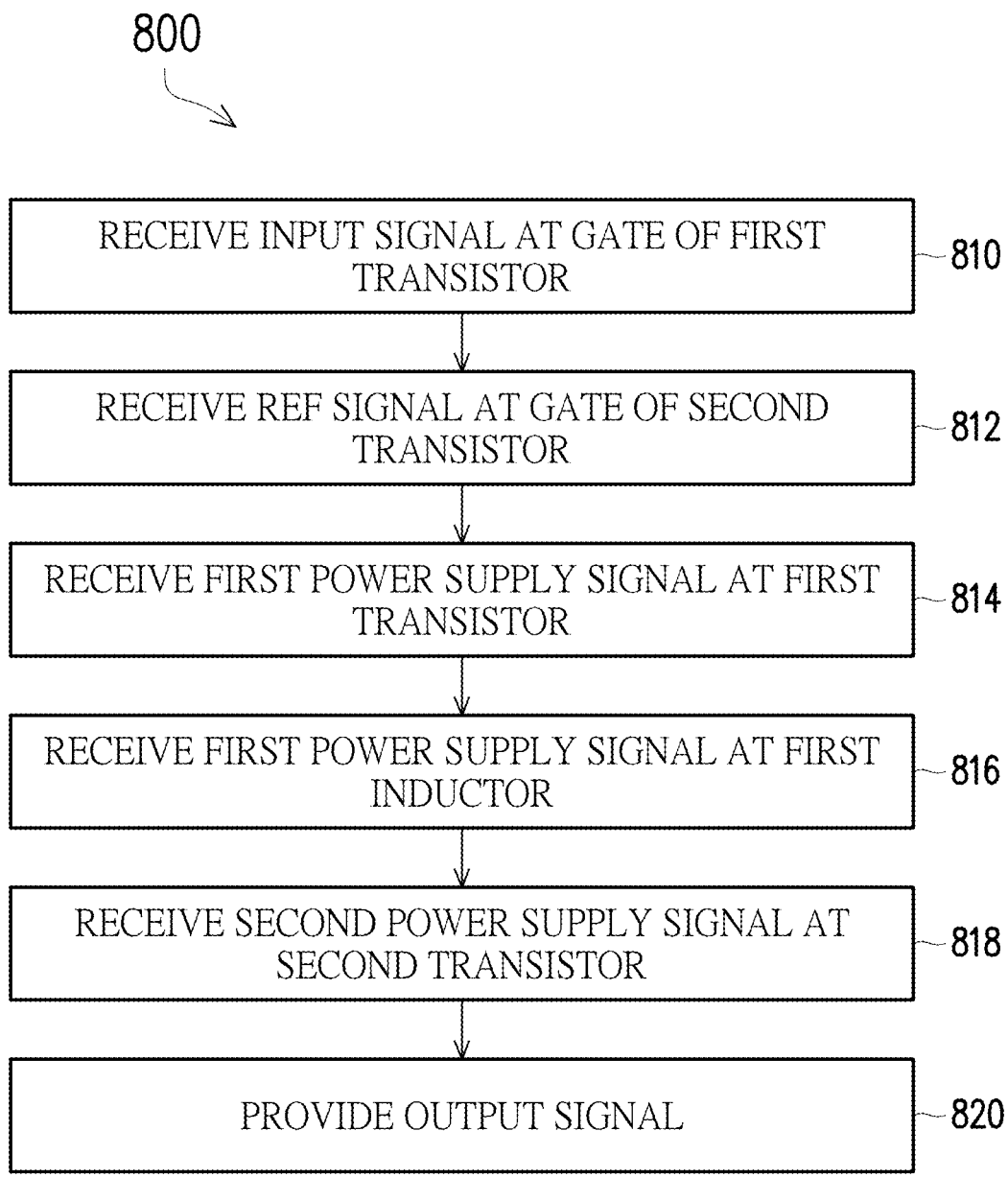
FIG. 8 illustrates an example of a method for amplifying an input voltage signal in accordance with some embodiments.

FIG. 8 is a flow diagram illustrating an example of a method 800 for amplifying an input voltage signal in accordance with embodiments disclosed herein. Referring to FIG. 8 together with FIG. 1 discussed above, the method 800 includes receiving an input signal Vin at a gate terminal of the transistor 104 as shown in block 810. In block 812, the reference signal Vref is received at a gate terminal of the transistor 102. As noted above, one of the transistors 102/104 is a first type, while the other of the transistors 102/104 is a second type complementary to the first type. For instance, the transistor 102 may be a p-type transistor while the transistor 104 is an n-type transistor. At blocks 814 and 816 a first power supply signal V1 is received at a first terminal 122 of the first transistor 104, and also at a first terminal 108 of a first inductor 106. The first inductor 106 has a second terminal 110 connected to a second terminal 112 of the first transistor 104 at the connecting node 114. A second power supply signal V2 is received at a first terminal 128 of a second inductor 126 at block 818. As shown in FIG. 1, the second inductor 126 has a second terminal 124 connected to an intermediate node 120 where a second terminal 118 of the first transistor 104 is connected to a second terminal 116 of the second transistor 102. At block 820, an output signal Vout is provided at the intermediate node 120. The output signal Vout is greater than the input signal Vin.

In one aspect, a power amplifier structure includes a first transistor of a first type configured as a transconductance amplifier. The first transistor is operably connected to a first power supply. A second transistor of a second type is configured as a current buffer amplifier. The second transistor is operably connected to the first transistor at an intermediate node. A first inductor is operably connected between the first power supply and a connecting node, where the second transistor is operably connected to the connecting node. A second inductor is operably connected between the intermediate node and a second power supply. The first transistor, the second transistor, and the first inductor are connected in series between the first power supply.

In another aspect, an electronic device includes an antenna and a power amplifier structure operably connected to the antenna. The power amplifier structure includes a first terminal of a first inductor operably connected to a first power supply and a second terminal of the first inductor operably connected to a connecting node. A first terminal of a first transistor of a first type is operably connected to the connecting node and a second terminal of the first transistor of the first type is operably connected to an intermediate node. A first terminal of a second transistor of a second type is operably connected to the intermediate node and a second terminal of the second transistor of the second type is operably connected to the first power supply. An output signal line is operably connected to the connecting node. A first terminal of a second inductor is operably connected to the intermediate node and a second terminal of the second inductor is operably connected to a second power supply. A capacitor is operably connected to a third terminal of the first transistor of the first type. A resistor is operably connected to a third terminal of the second transistor of the second type. The first transistor of the first type, the second transistor of the second type, and the first inductor are connected in series between the first power supply.

In yet another aspect, a power amplifier structure includes a first power amplifier circuit and a second power amplifier circuit connected in parallel with the first power amplifier circuit. The first and the second power amplifier circuits each include a first terminal of a first transistor of a first type operably connected to a connecting node and a second terminal of the first transistor of the first type operably connected to an intermediate node; a first terminal of a second transistor of a second type operably connected to the intermediate node and a second terminal of the second transistor of the second type operably connected to a first power supply; and a first terminal of an inductor operably connected to the intermediate node and a second terminal of the inductor operably connected to a second power supply. A first neutralization capacitor is operably connected between the intermediate node of the second power amplifier circuit and a third terminal of the second transistor of the first power amplifier circuit. A second neutralization capacitor is operably connected between the intermediate node of the first power amplifier circuit and a third terminal of the second transistor of the second power amplifier circuit. A first transformer is operably connected to the first terminals of the first transistors in the first and the second power amplifier circuits. A second transformer operably connected to the third terminals of the second transistors in the first and the second power amplifier circuits.

In another aspect, a method of amplifying an input voltage signal includes receiving an input signal at a gate terminal of a first transistor. The first transistor is a first type. A reference signal is received at a gate terminal of a second transistor. The second transistor is a second type complementary to the first type. A first power supply signal is received at a first terminal of the first transistor, and the first power supply signal is received at a first terminal of a first inductor. The first inductor has a second terminal connected to a second terminal of the first transistor at a connecting node. A second power supply signal is received at a first terminal of a second inductor. The second inductor having a second terminal connected to an intermediate node where a second terminal of the first transistor is connected to a second terminal of the second transistor. An output signal is provided at the intermediate node, where the output signal is greater than the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power amplifier structure, comprising:
 a first transistor of a first type configured as a transconductance amplifier, the first transistor operably connected to a first power supply;
 a second transistor of a second type configured as a current buffer amplifier, the second transistor operably connected to the first transistor at an intermediate node;
 a first inductor operably connected between the first power supply and a connecting node, the second transistor operably connected to the connecting node; and
 a second inductor operably connected between the intermediate node and a second power supply, wherein the first transistor, the second transistor, and the first inductor are connected in series between the first power supply.

2. The power amplifier structure of claim 1, further comprising:
 a resistor operably connected between a terminal of the first transistor and a third power supply; and
 a capacitor operably connected to a terminal of the second transistor.

3. The power amplifier structure of claim 2, further comprising a fourth power supply operably connected to the terminal of the second transistor.

4. The power amplifier structure of claim 1, wherein:
 the first transistor of the first type is an n-type transistor;
 the second transistor of the second type is a p-type transistor;
 the first power supply is Vss; and
 the second power supply is Vdd.

5. The power amplifier structure of claim 1, wherein:
 the first transistor of the first type is a p-type transistor;
 the second transistor of the second type is an n-type transistor;
 the first power supply is Vdd; and
 the second power supply is Vss.

6. The power amplifier structure of claim 1, wherein the first and the second transistors are each implemented as a metal-oxide-silicon transistor.

7. The power amplifier structure of claim 1, further comprising an output signal line operably connected to the connecting node.

8. The power amplifier structure of claim 1, wherein at least one of the first inductor or the second inductor is implemented as co-planar waveguide transmission line.

9. The power amplifier structure of claim 1, wherein the first inductor functions as a primary coil of a transformer.

10. The power amplifier structure of claim 9, further comprising a neutralization capacitor operably connected to the intermediate node of the power amplifier circuit.

11. The power amplifier structure of claim 10, wherein:
the transformer is a first transformer; and
the power amplifier structure further comprises a second transformer operably connected to a gate of the second transistor of the second type.

12. An electronic device, comprising:
an antenna; and
a power amplifier structure operably connected to the antenna, the power amplifier structure comprising:
  a first terminal of a first inductor operably connected to a first power supply and a second terminal of the first inductor operably connected to a connecting node;
  a first terminal of a first transistor of a first type operably connected to the connecting node and a second terminal of the first transistor of the first type operably connected to an intermediate node;
  a first terminal of a second transistor of a second type operably connected to the intermediate node and a second terminal of the second transistor of the second type operably connected to the first power supply;
  an output signal line operably connected to the connecting node;
  a first terminal of a second inductor operably connected to the intermediate node and a second terminal of the second inductor operably connected to a second power supply;
  a capacitor operably connected to a third terminal of the first transistor of the first type; and
  a resistor operably connected to a third terminal of the second transistor of the second type,
  wherein the first transistor of the first type, the second transistor of the second type, and the first inductor are connected in series between the first power supply.

13. The device of claim 12, wherein:
the first transistor of the first type is an n-type transistor;
the second transistor of the second type is a p-type transistor;
the first power supply is Vdd; and
the second power supply is Vss.

14. The device of claim 13, wherein the capacitor is operably connected between the third terminal of the first transistor of the first type and the second power supply.

15. The device of claim 12, wherein:
the first transistor of the first type is a p-type transistor;
the second transistor of the second type is an n-type transistor;
the first power supply is Vss; and
the second power supply is Vdd.

16. The device of claim 15, wherein the capacitor is operably connected between the third terminal of the first transistor of the first type and the first power supply.

17. The device of claim 12, wherein the first transistor of the first type is configured as a common-gate amplifier and the second transistor of the second type is configured as a common-source amplifier.

18. The device of claim 12, further comprising a neutralization capacitor operably connected to the intermediate node of the power amplifier circuit.

19. A method, comprising:
receiving an input signal at a gate terminal of a first transistor, the first transistor being a first type;
receiving a reference signal at a gate terminal of a second transistor, the second transistor being a second type complementary to the first type;
receiving a first power supply signal at a first terminal of the first transistor;
receiving the first power supply signal at a first terminal of a first inductor, the first inductor having a second terminal connected to a second terminal of the first transistor at a connecting node;
receiving a second power supply signal at a first terminal of a second inductor, the second inductor having a second terminal connected to an intermediate node where a second terminal of the first transistor is connected to a second terminal of the second transistor; and
providing an output signal at the intermediate node, where the output signal is greater than the input signal.

20. The method of claim 19, wherein the first transistor is configured as a transconductance amplifier to output a current at the second terminal of the first transistor that is proportional to the input signal, and wherein the second transistor is configured as a current buffer amplifier to absorb the current output by the first transistor.

* * * * *